United States Patent
Takemasa et al.

(10) Patent No.: US 12,347,806 B2
(45) Date of Patent: Jul. 1, 2025

(54) METHOD OF MOUNTING ELECTRONIC COMPONENT

(71) Applicant: Japan Display Inc., Tokyo (JP)

(72) Inventors: Kenichi Takemasa, Tokyo (JP); Kazuyuki Yamada, Tokyo (JP); Keisuke Asada, Tokyo (JP); Daiki Isono, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 530 days.

(21) Appl. No.: 17/706,612

(22) Filed: Mar. 29, 2022

(65) Prior Publication Data
US 2022/0320041 A1    Oct. 6, 2022

(30) Foreign Application Priority Data

Apr. 2, 2021 (JP) .................................. 2021-063629

(51) Int. Cl.
*H01L 23/00* (2006.01)
*H01L 25/075* (2006.01)

(52) U.S. Cl.
CPC .......... *H01L 24/97* (2013.01); *H01L 25/0753* (2013.01); *H01L 2224/95136* (2013.01)

(58) Field of Classification Search
CPC .............. H01L 24/97; H01L 25/0753; H01L 2224/95136; H01L 24/75; H01L 24/81; H01L 24/95; H01L 33/0095; H01L 33/0093; H01L 27/156; H01L 21/67121; H01S 5/00; B23K 26/00; H10H 20/01; H10H 29/142; H10H 20/018
See application file for complete search history.

(56) References Cited

U.S. PATENT DOCUMENTS

| 10,770,426 B2 | 9/2020 | Hwangbo et al. |
| 2017/0133357 A1* | 5/2017 | Kuo ...................... H01L 25/167 |
| 2019/0114974 A1* | 4/2019 | Chen .................. G02F 1/133512 |
| 2020/0243708 A1 | 7/2020 | Yanagawa et al. |

FOREIGN PATENT DOCUMENTS

| CN | 108538878 A | 9/2018 | |
| JP | 2019-83280 A | 5/2019 | |
| WO | 2016158808 A1 | 10/2016 | |
| WO | WO-2020062750 A1 * | 4/2020 | ....... H01L 21/67144 |
| WO | 2020261892 A1 | 12/2020 | |

OTHER PUBLICATIONS

Japanese Office Action issued Nov. 5, 2024, in corresponding Japanese Patent Application No. 2021-063629, 6pp.
Chinese Office Action issued Nov. 29, 2024, in corresponding Chinese Patent Application No. 202210347325.1 8pp.

* cited by examiner

*Primary Examiner* — Ermias T Woldegeorgis
(74) *Attorney, Agent, or Firm* — XSENSUS LLP

(57) ABSTRACT

According to one embodiment, a method of mounting electronic components, includes placing a workpiece comprising an insulating substrate including a first surface, a circuit board including a terminal portion and a spacer, a sapphire substrate including a second surface and a wafer including the electronic components, bringing the pressure jig into contact with a part of the sapphire substrate to apply a load on a contact part between a part of an upper surface of the spacer and the second surface, pressing the sapphire substrate toward the circuit board with the pressure jig, to bring other part of the upper surface of the spacer into contact with the second surface and flatten the sapphire substrate.

5 Claims, 15 Drawing Sheets

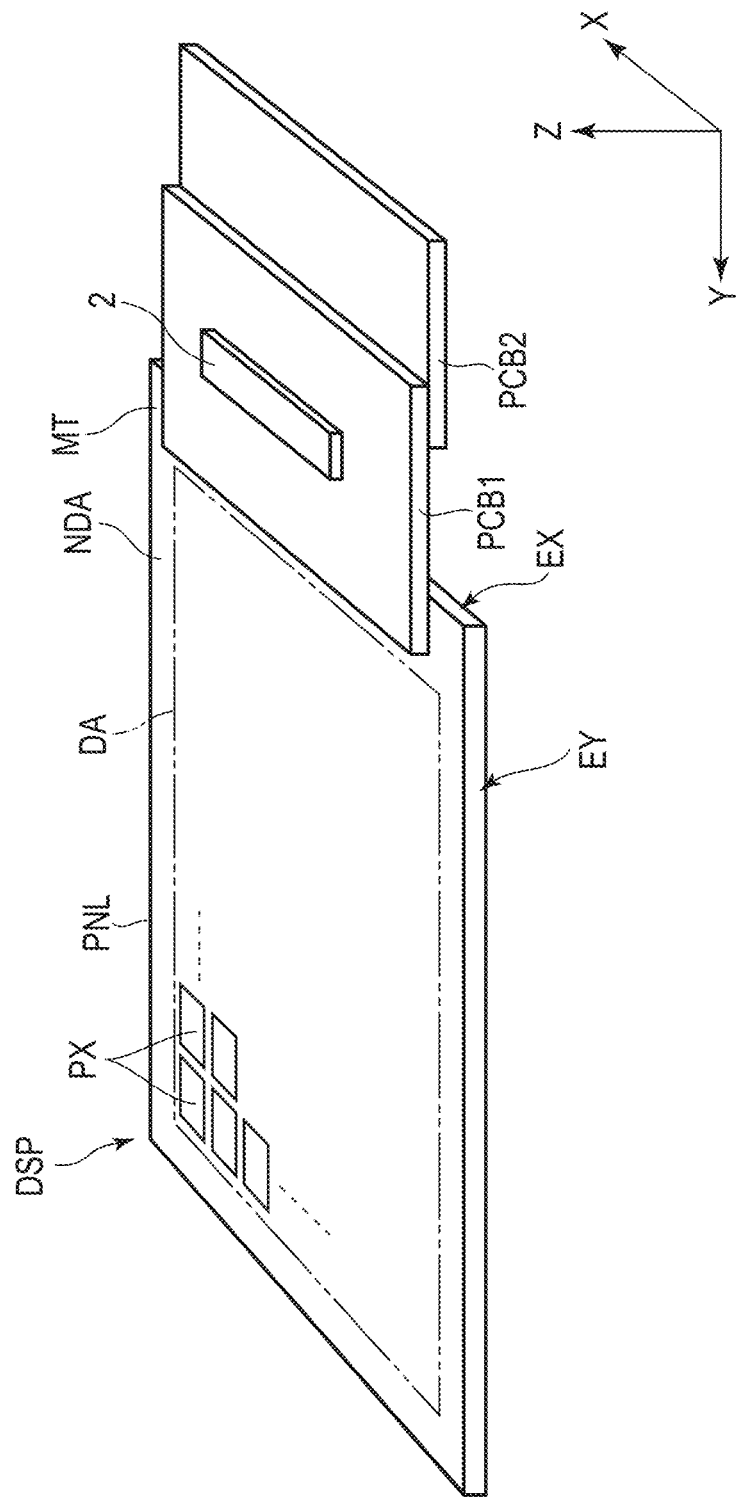
F I G. 1

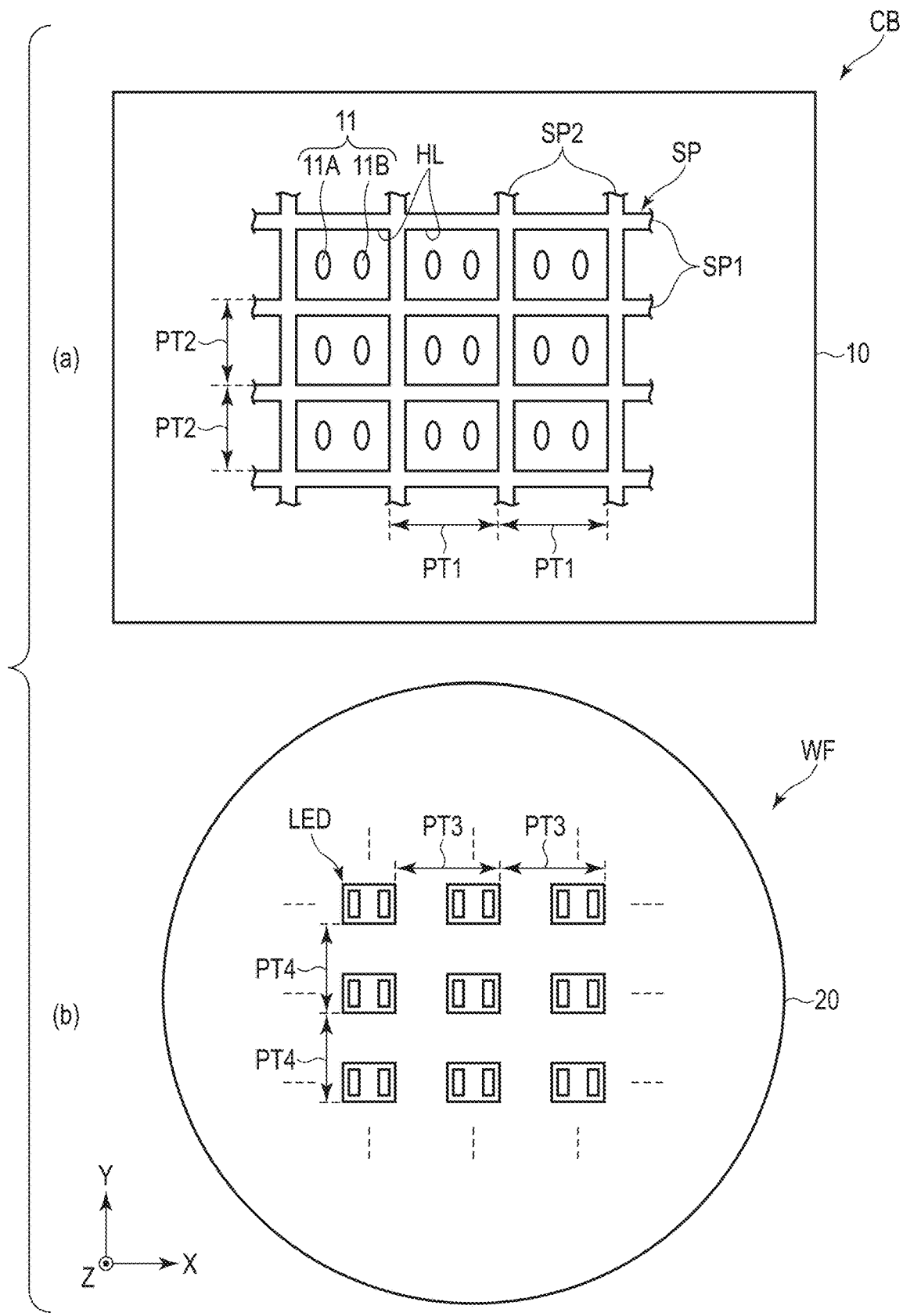
F I G. 11

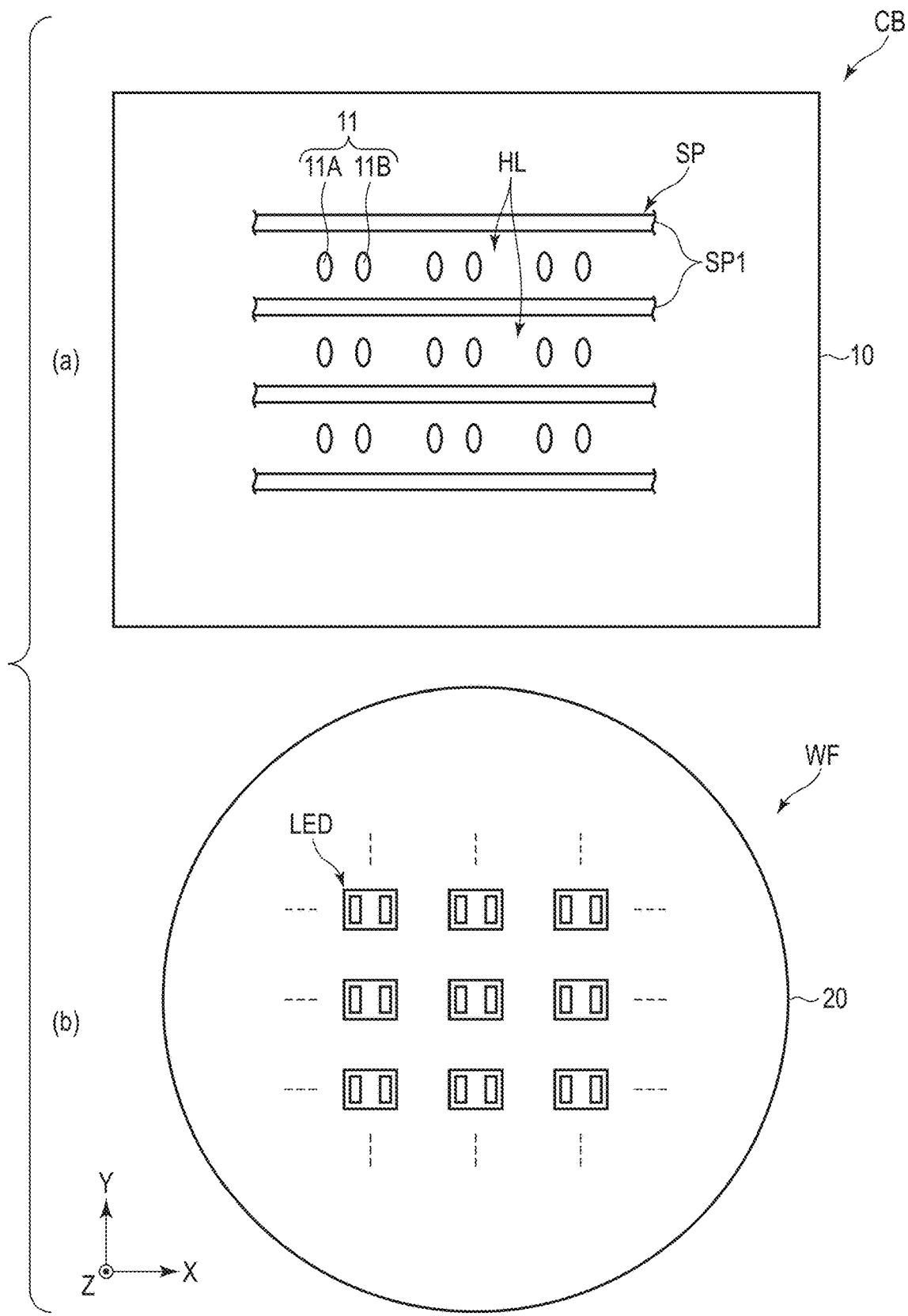
F I G. 15

METHOD OF MOUNTING ELECTRONIC COMPONENT

CROSS-REFERENCE TO RELATED APPLICATIONS

This application is based upon and claims the benefit of priority from Japanese Patent Application No. 2021-063629, filed Apr. 2, 2021, the entire contents of which are incorporated herein by reference.

FIELD

Embodiments described herein relate generally to a method of mounting electronic components, a display device, and a circuit board.

BACKGROUND

LED display devices using light-emitting diodes (LEDs), which are self-luminous devices, are generally known. In recent years, a display device using a minute diode element called a micro LED has been developed as a display device with higher resolution. Unlike conventional liquid crystal displays or organic EL displays, the micro LED display is formed in such a configuration that a large number of chip-shaped micro LEDs are mounted in the display area, and therefore it is easy to achieve both high resolution and large size, and is attracting attention as a next-generation display device.

As a method of mounting a large number of chip-shaped micro-LEDs on the display area, a technique which uses laser lift-off (LLO) is known. These micro-LEDs are formed on a sapphire substrate before being mounted on the display area. Here, when removing the micro-LEDs from the sapphire substrate by LLO, if the sapphire substrate is warped, there is a risk that the laser beam may not be irradiated to the desired position. In order to solve this, a method of flattening the warp of the sapphire substrate by pressing the entire surface of the substrate is known.

BRIEF DESCRIPTION OF THE DRAWINGS

FIG. 1 is a perspective view schematically showing a configuration of a display device.

FIG. 11 is a plan view showing the circuit board and the wafer of this embodiment.

FIG. 15 is a plan view showing a circuit board and a wafer according to a second modified example.

DETAILED DESCRIPTION

Figure 2:
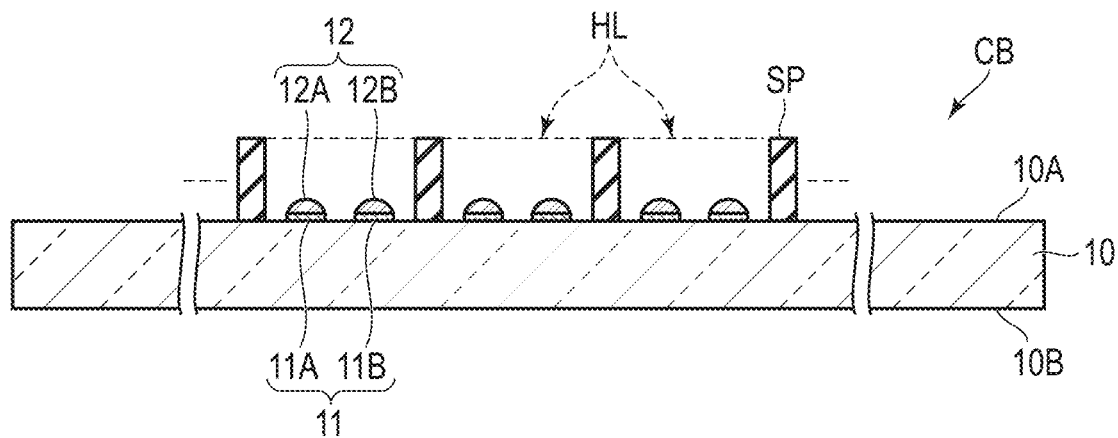
FIG. 2 is a cross-sectional view schematically showing a configuration of a circuit board.

In general, according to one embodiment, a method of mounting electronic components, comprises placing a workpiece comprising an insulating substrate including a first surface, a circuit board including a terminal portion located on a side of the first surface and a spacer, a sapphire substrate including a second surface and a wafer including the electronic components located on a side of the second surface, between a stage and a pressure jig so that the first surface and the second surface oppose each other, bringing the pressure jig into contact with a part of the sapphire substrate to apply a load on a contact part between a part of an upper surface of the spacer and the second surface, pressing the sapphire substrate toward the circuit board with the pressure jig to bring other part of the upper surface of the spacer into contact with the second surface and flatten the sapphire substrate, irradiating first laser beam onto the workpiece through a window of the pressure jig, and joining the electronic components to the circuit board, irradiating second laser light having a wavelength band different from that of the first laser light onto the workpiece through the window, to remove the electronic components from the sapphire substrate, and releasing the pressure jig from the sapphire substrate.

According to another embodiment, a display device comprises an insulating substrate including a first surface, a spacer located on a side of the first surface and including a plurality of hole portions and a plurality of electronic components located on the side of the first surface and located in the hole portions, and the spacer is formed of aluminum oxide.

According to still another embodiment, a circuit board comprises an insulating substrate including a first surface, a spacer located on a side of the first surface and including a plurality of hole portions and a plurality of terminal portions located on the side of the first surface and located in the hole portions, and the spacer being formed of aluminum oxide.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

FIG. 1 is a perspective view schematically showing a configuration of a display device DSP.

In this embodiment, a first direction X, a second direction Y and a third direction Z are defined as indicated in the figure. The second direction Y is perpendicular to the first direction X and the third direction Z is perpendicular to the first direction X and the second direction Y. The first direction X and the second direction Y are orthogonal to each other, but they may intersect at an angle other than right angles. In the following descriptions, a direction forwarding a tip of an arrow indicating the third direction Z is referred to as "upward" and a direction forwarding oppositely from the tip of the arrow is referred to as "downward". Further, it is assumed that there is an observation position to observe the display device DSP and the manufacturing device on a tip side of an arrow in the third direction Z, and viewing from this observation position toward the X-Y plane defined by the first direction X and the second direction Y is referred to as a planar view.

In this specification, as an example as an electronic component, an LED chip (light-emitting element) used in the display device DSP is described.

The following descriptions are directed to the case where the display device DSP is a micro LED display device using a micro LED, which is a self-luminous element.

As shown in FIG. 1, the display device DSP comprises a display panel PNL, printed circuit boards PCB1 and PCB2 and a drive IC chip 2.

The display panel PNL is, for example, rectangular in shape. In the example illustrated, a short edge EX of the display panel PNL is parallel to the first direction X, and a long edge EY of the display panel PNL is parallel to the second direction Y. The third direction Z is equivalent to the thickness direction of the display panel PNL. The main surface of the display panel PNL is parallel to the X-Y plane defined by the first direction X and the second direction Y. The display panel PNL includes a display area DA and a non-display area NDA on an outer side of the display area DA. In the example illustrated, the non-display area NDA surrounds the display area DA. The display panel PNL includes a terminal region MT in the non-display area NDA. The terminal region MT is provided along the short edge EX of the display panel PNL and includes terminals for electrically connecting the display panel PNL to an external device or the like.

The display area DA is an area which displays images and comprises a plurality of pixels PX arranged in a matrix, for example. Each of the pixels PX includes a light-emitting element (micro LED), a switching element for driving the light-emitting element, and the like.

The printed circuit board PCB1 is mounted on the terminal region MT and is electrically connected to the display panel PNL. The printed circuit board PCB1 is, for example, a flexible printed circuit board. The printed circuit board PCB2 is connected to the printed circuit board PCB1, for example, below the printed circuit board PCB1. The printed circuit board PCB2 is, for example, a rigid printed circuit board.

The drive IC chip 2 is mounted on the printed circuit board PCB1. Note that the driver IC chip 2 may be mounted under the printed circuit board PCB1, or it may be mounted in the non-display area NDA of the display panel PNL, or on the printed circuit board PCB2. The drive IC chip 2 is connected to a control substrate, which is not shown in the figure, via, for example, the printed circuit boards PCB1 and PCB2. The driver IC chip 2 executes the control of driving a plurality of pixels PX and displaying the images on the display panel PNL, based on video signals output from the control board.

Now, a method of mounting light-emitting elements LED on a circuit board CB, which serves as the base substrate for the display panel PNL discussed above will be described. In more detail, a method of removing the light-emitting elements LED from the wafer WF shown in FIG. 3 by laser lift-off (LLO), and mounting them on the circuit board CB shown in FIG. 2, will be described.

First, with reference to FIGS. 2 and 3, the configuration of the circuit board CB and the wafer WF will be described.

FIG. 2 is a cross-sectional view showing the configuration of the circuit board CB.

The circuit board CB comprises an insulating substrate 10, a plurality of terminal portions 11, a plurality of joint members 12 and a spacer SP.

The insulating substrate 10 is, for example, a glass substrate or a flexible resin substrate, and includes a surface (first surface) 10A and a surface 10A on an opposite side to the surface 10A. Although the illustration is omitted, switching elements and various wiring patterns for driving the light-emitting elements LED are formed on the insulating substrate 10. The switching elements are each a thin-film transistor, and the circuit board CB is, in some cases, referred to as an array board or backplane board.

The terminal portions 11 are located on a surface 10A side of the insulating substrate 10. Each terminal portion 11 comprises a pair of first and second electrodes 11A and 11B. For example, the number of terminal portions 11 formed is the same as the number of light emitting elements LED mounted on the display device DSP. The terminal portions 11 are each made of, for example, a metal material such as aluminum (Al), titanium (Ti), molybdenum (Mo), tungsten (W) or the like, or a stacked layer body of these metal materials.

The joint members 12 are respectively disposed on the terminal portion 11. Each joint member 12 comprises a pair of a first joint member 12A and a second joint member 12B. The first joint member 12A is located on the first electrode 11A. The second joint member 12B is located on the second electrode 11B. Each joint member 12 is a member for joining the respective terminal portion 11 and the terminal portion 22 of the light-emitting element LED, (which will be described later). Although the details will be provided later, each joint member 12 is made of a metal material that heats and melts by laser ablation when irradiated with laser light in a wavelength band of 400 nm to 3,000 nm, which is, for example, a metal material tin (Sn), silver (Ag) or the like. The joint member 12 may be referred to as a solder member. In the example illustrated, the joint members 12 are provided on the terminal portions 11, respectively, but they may as well be provided on the terminal portions 22 of the light-emitting elements LED, which will be described later.

The spacer SP is located on a surface 10A side of the insulating substrate 10. The spacer SP is formed as an integrated boy and includes a plurality of hole portions HL, as described later with reference to FIG. 11. The spacer SP is formed, for example, of aluminum oxide ($Al_2O_3$). The terminal portions 11 are respectively located in the hole portions HL.

Figure 3:
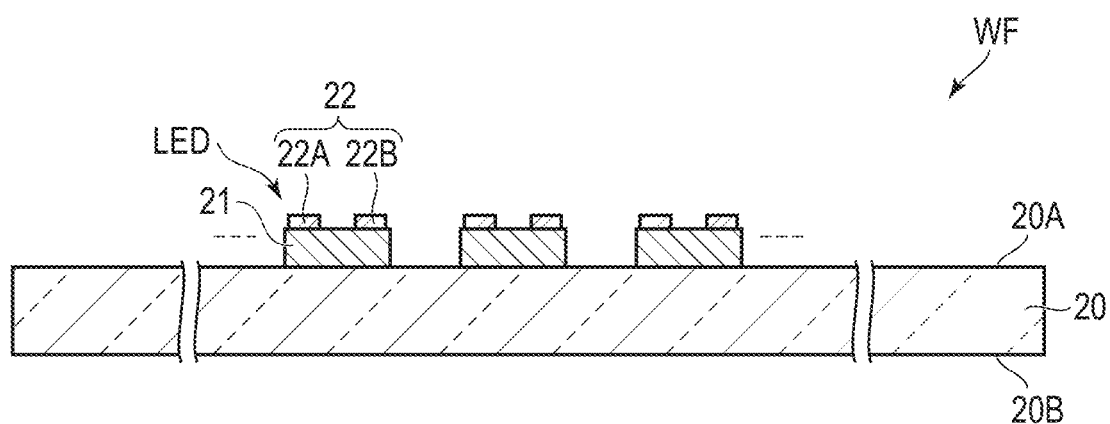
FIG. 3 is a cross-sectional view schematically showing a configuration of a wafer.

FIG. 3 is a cross-sectional view schematically showing a configuration of the wafer WF.

The wafer WF comprises a sapphire substrate 20 and a plurality of light-emitting elements (electronic components) LED. The sapphire substrate 20 includes a surface (second surface) 20A and a surface 20B on an opposite side to the surface 20A. The sapphire substrate 20 is formed of $Al_2O_3$.

The light-emitting elements LED are located on a surface 20A side of the sapphire substrate 20. The light-emitting elements LED each comprise a light-emitting layer 21 and a terminal portion 22.

The light-emitting layers 21 are fixated to the surface 20A of the sapphire substrate 20 via a release layer (not shown). The terminal portions 22 are respectively disposed on the light-emitting layers 21. Each terminal portion 22 comprises a pair of a first electrode 22A and a second electrode 22B. One of the first and second electrodes 22A and 22B corresponds to an anode electrode and the other corresponds to a cathode electrode. The terminal portion 22 is joined to the respective terminal 11 by the respective joint member 12 placed on a circuit board CB side, and is electrically connected to the terminal 11. The terminal portions 22 may be each referred to as a bump.

Next, with reference to FIGS. 4 to 9, the mounting method for mounting light-emitting elements LED on the circuit board CB will be explained. In the following descriptions, a stacked body in which the above-described circuit board CB and wafer WF are stacked, will be referred to as a workpiece WK.

Figure 4:
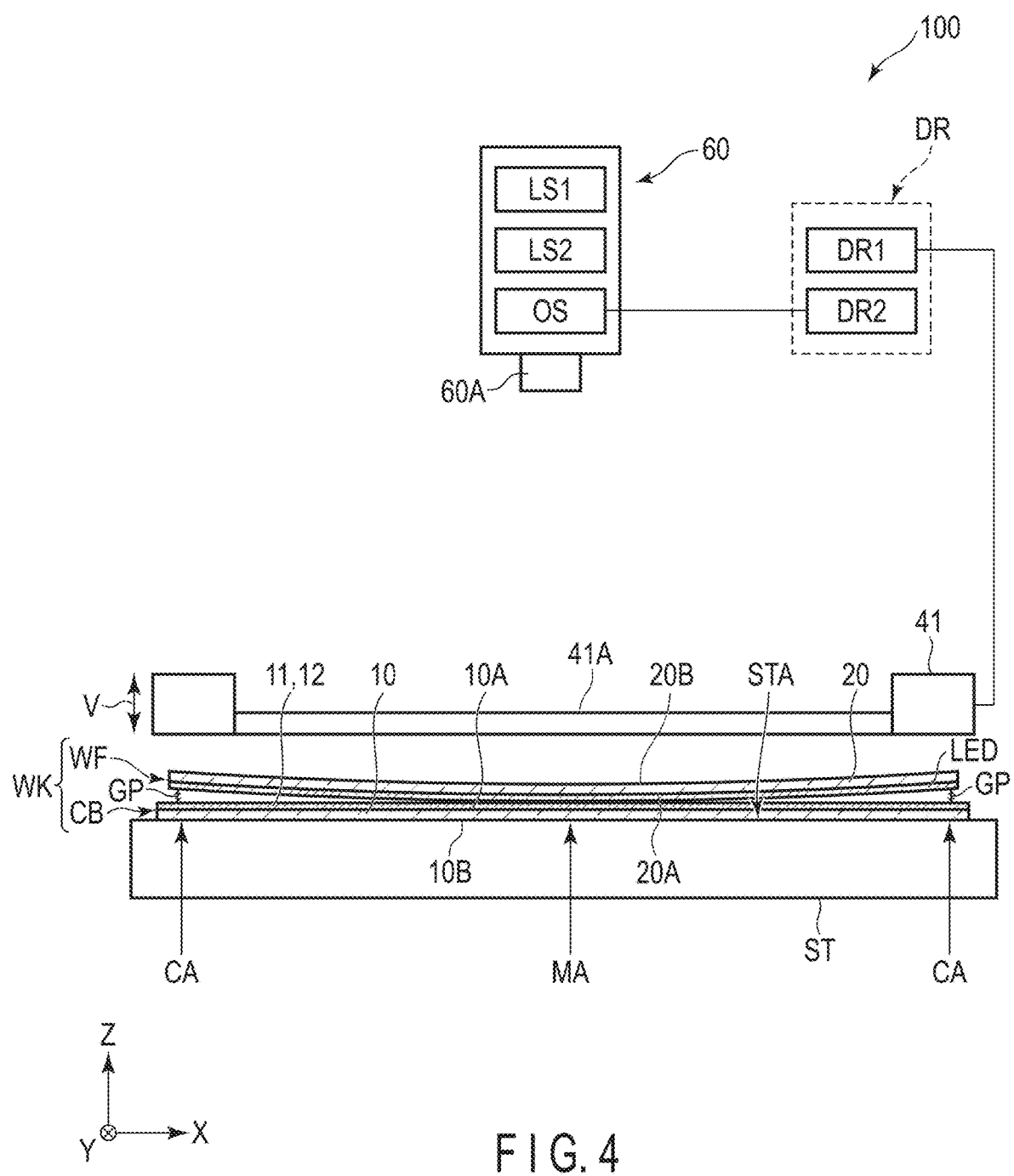
FIG. 4 is a diagram showing a first step of a mounting method of this embodiment.

FIG. 4 is a diagram showing a first step of the mounting method. The first step shows the process of placing a workpiece WK on a stage ST. Note that the terminal portion 11 and the joint member 12 of the circuit board CB and the light-emitting element LED of the wafer WF are each illustrated in a simplified way.

First, the configuration of a mounting device 100 will be explained. The mounting device 100 is a device for mounting the light-emitting elements LED on the wafer WF onto the circuit board CB.

The mounting device 100 comprises a stage ST on which a workpiece is to be placed, a pressure jig 41, a laser device 60, and a drive unit DR.

The stage ST includes a support surface STA which supports the workpiece.

The pressure jig 41 opposes the stage ST along the third direction Z. The pressure jig 41 is configured to pressurize the workpiece WK between the pressure jig 41 itself and the stage ST. The pressure jig 41 includes a window portion 41A opposing the support surface STA along the third direction Z. The window portion 41A is made of a transparent material, for example, and transmits laser light.

The laser system 60 includes a first laser source LS1, a second laser source LS2, an optical system OS, and a laser head 60A. The first laser source LS1 emits a first laser beam LZ1. The second laser source LS2 emits a second laser beam LZ2 (see FIGS. 7 and 8). The optical system OS includes, for example, mirrors which adjust optical paths of the first laser beam LZ1 and the second laser beam LZ2. The laser device 60 emits the first laser beam LZ1 and the second laser beam LZ2 from the laser head 60A.

The drive unit DR includes a first drive unit DR1 that controls the drive of the pressure jig 41, and a second drive unit DR2 that controls the drive of the laser device 60. The first drive unit DR1 moves the pressure jig 41 along the vertical direction V with respect to the support surface STA. Here, the vertical direction V is a direction parallel to the third direction Z. The second drive unit DR2 emits the first laser beam LZ1 and the second laser beam LZ2 from the laser device 60. Further, the second drive unit DR2 moves the laser head 60A, for example.

Here, the first step will now be described. A workpiece WK consisting of a circuit board CB and a wafer WF stacked one on another is placed between the stage ST and the pressure jig 41. Note that the pressure jig 41 may be placed on the workpiece WK after the workpiece WK is placed on the stage ST. The circuit board CB and the wafer WF are stacked such that the surface 10A of the insulating substrate 10 A and the surface 20A of the sapphire substrate 20 face each other. The surface 10B of the insulating substrate 10 is in contact with the support surface STA. The surface 20B of the sapphire substrate 20 faces the pressure jig 41. When the workpiece WK is placed on the stage ST, the circuit board CB and the wafer WF are positioned with each other.

In this embodiment, it is assumed that the wafer WF is warped. In other words, there is partially a gap GP created between the circuit board CB and the wafer WF. In the example illustrated, the gap GP increases towards a peripheral portion CA of the workpiece WK. On the other hand, in a central portion MA of the workpiece WK, the circuit board CB and the wafer WF are in contact with each other.

Figure 5:
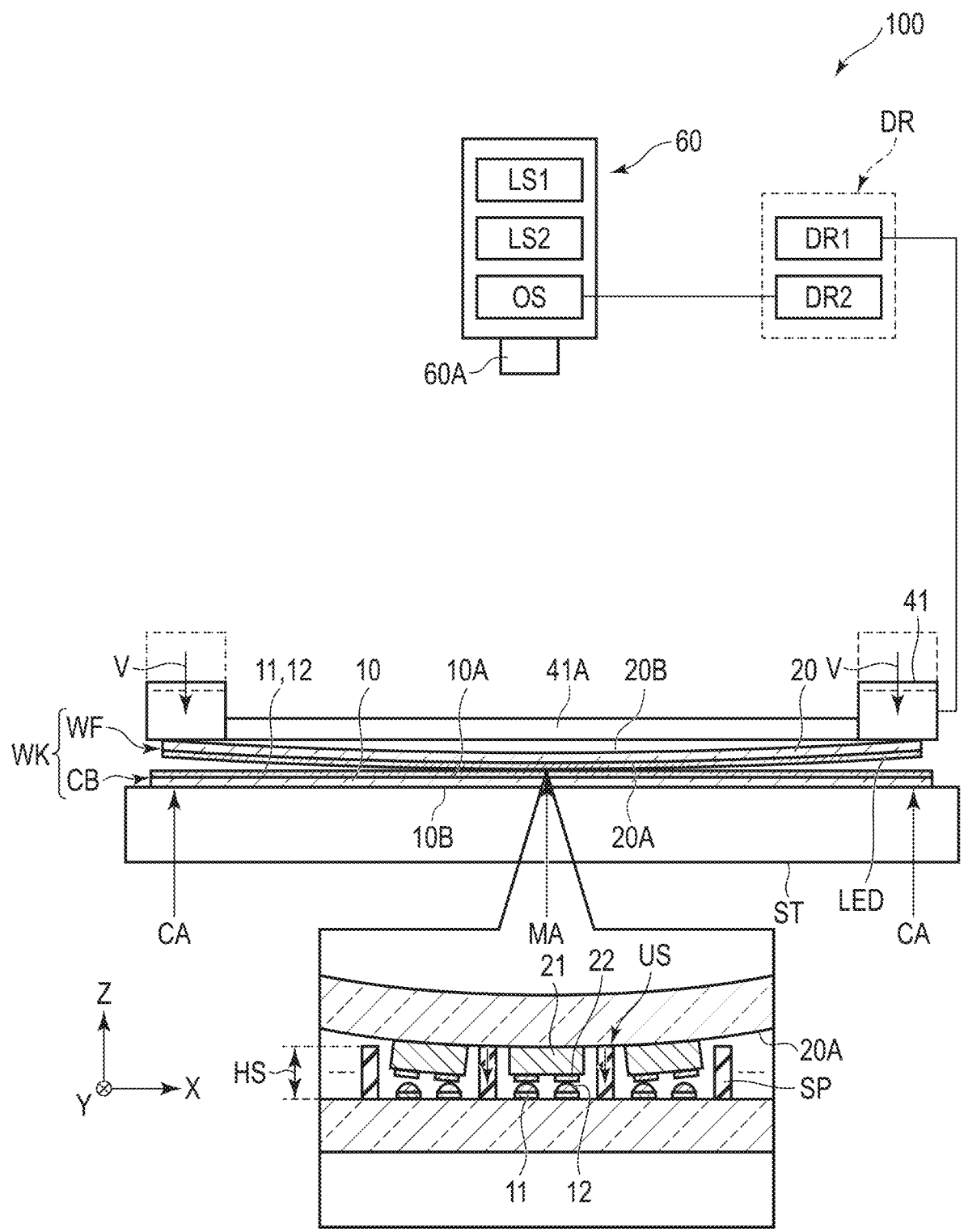
FIG. 5 is a diagram showing a second step of the mounting method of this embodiment.

FIG. 5 is a diagram showing a second step of the mounting method of this embodiment. The second step shows the process of bringing the pressure jig 41 into contact with the workpiece WK on the stage ST.

The first drive unit DR1 moves the pressure jig 41 toward the stage ST along the vertical direction V, to bring it into contact with a part of the sapphire substrate 20. The first drive unit DR1 further pressurizes the sapphire substrate 20 with the pressure jig 41 toward the circuit board CB, and applies the load on the contacting part between a part of an upper surface US of the spacer SP and the surface 20A. At this time, the other part of the upper surface US of the spacer SP is separated from the surface 20A. Further, in the central portion MA of the workpiece WK, the terminal portions 22 of the respective light-emitting elements LED are in contact with the respective joint members 12 or slightly crush the joint members 12.

The height HS of the spacer SP is equal to or less than the total of the thicknesses of the terminals 11, the joint members 12, the terminal portions 22, and the light-emitting layers 21. If the height HS is less than the total of the thicknesses of the above-mentioned members, the joint members 12 are crushed slightly from their original shape when the sapphire substrate 20 is pressurized with the pressure jig 41.

Figure 6:
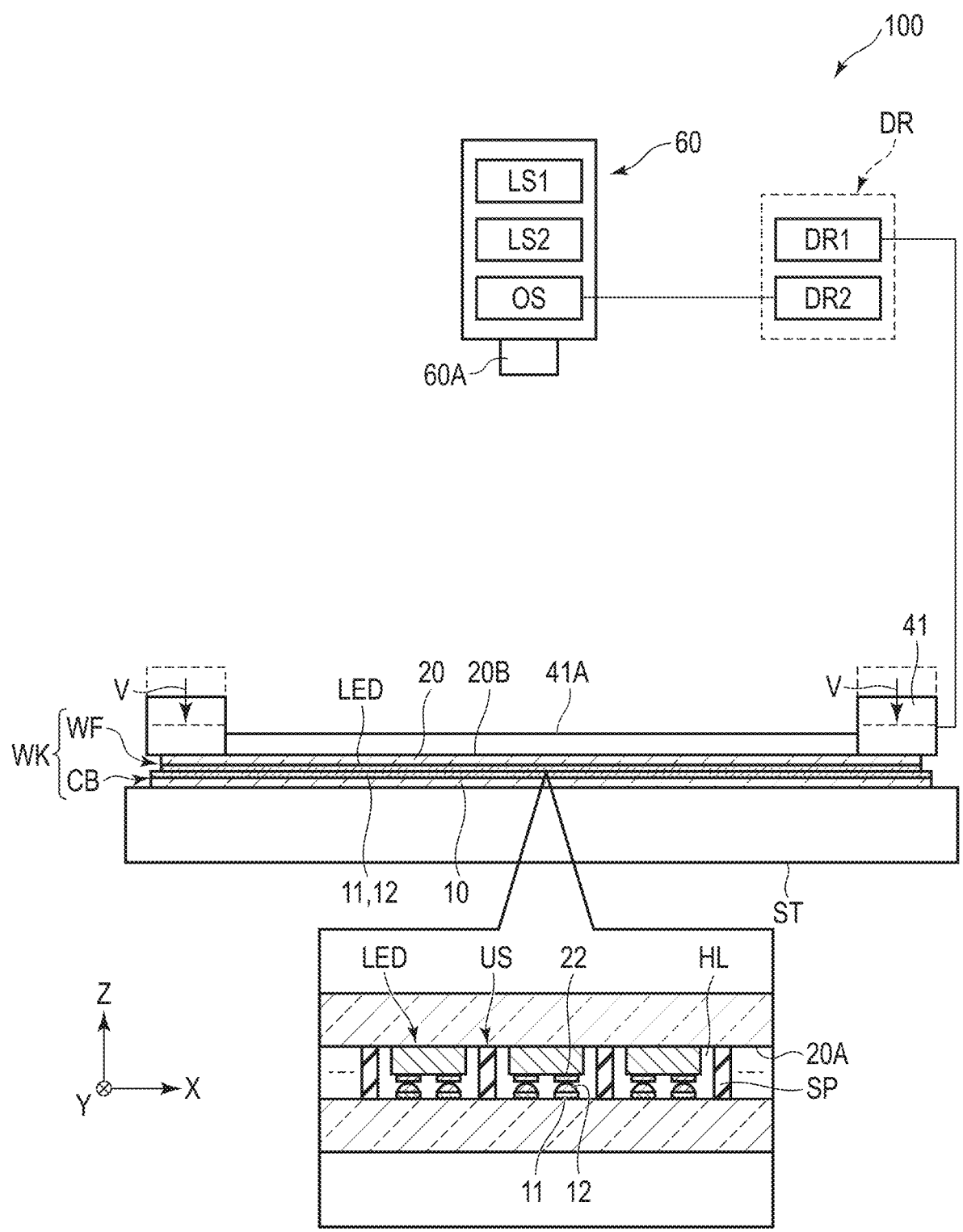
FIG. 6 is a diagram showing a third step of the mounting method of this embodiment.

FIG. 6 is a diagram showing a third step of the mounting method of the embodiment. The third step shows the process of pressurizing the workpiece WK towards the stage ST side by the pressure jig 41.

The first drive unit DR1 moves the pressure jig 41 along the vertical direction toward the stage ST side. In other words, the first drive unit DR1 further pressurizes the sapphire substrate 20 toward the circuit board CB side from the state shown in FIG. 5. As a result, the sapphire substrate 20 is flattened. At this time, the light-emitting elements LED are contained in the respective hole portions HL. Further, the other part of the upper surface US of the spacer SP and the surface 20A, which are illustrated to be separated in FIG. 5, are brought into contact with each other. For example, the entire upper surface US of the spacer SP and the surface 20A are brought into contact with each other. The pressure jig 41 fixes the workpiece WK between the stage ST and itself. The workpiece WK is fixed in the state where the terminal portions 11 of the circuit board CB and the terminal portions 22 of the wafer WF are superimposed on each other. The window 41A is in contact with the surface 20B of the sapphire substrate 20.

As described above, the warp of the sapphire substrate 20 is straightened to bring the circuit board CB and the wafer WF into tight contact with each other, and thus the light-emitting elements LED can be joined to the circuit board CB.

For example, in the step of flattening the sapphire substrate 20, as shown in FIG. 5, the largest load is applied to the position where the circuit board CB and wafer WF first come into contact with each other, and the respective terminal portions 11, joint members 12 and terminal portions 22 may be crushed excessively. Further, this may cause a short circuit.

According to this embodiment, the upper surface US of the spacer SP and the surface 20A are in contact each other. With this configuration, the contacting part between the upper surface US of the spacer SP and the surface 20A receives a load, and therefore the load applied to the respective terminal portions 11, joint members 12 and terminal portions 22 can be reduced. Therefore, the terminal portion 11, joint members 12, and terminal portions 22 can be suppressed from being excessively crushed by the load, thereby making it possible to suppress the occurrence of a short circuit. Thus, the manufacturing yield can be improved.

The rigidity of the spacer SP is equal to or greater than the rigidity of the sapphire substrate 20. Therefore, the spacer SP does not deform even if a load is applied to straighten the warp of the sapphire substrate 20.

Figure 7:
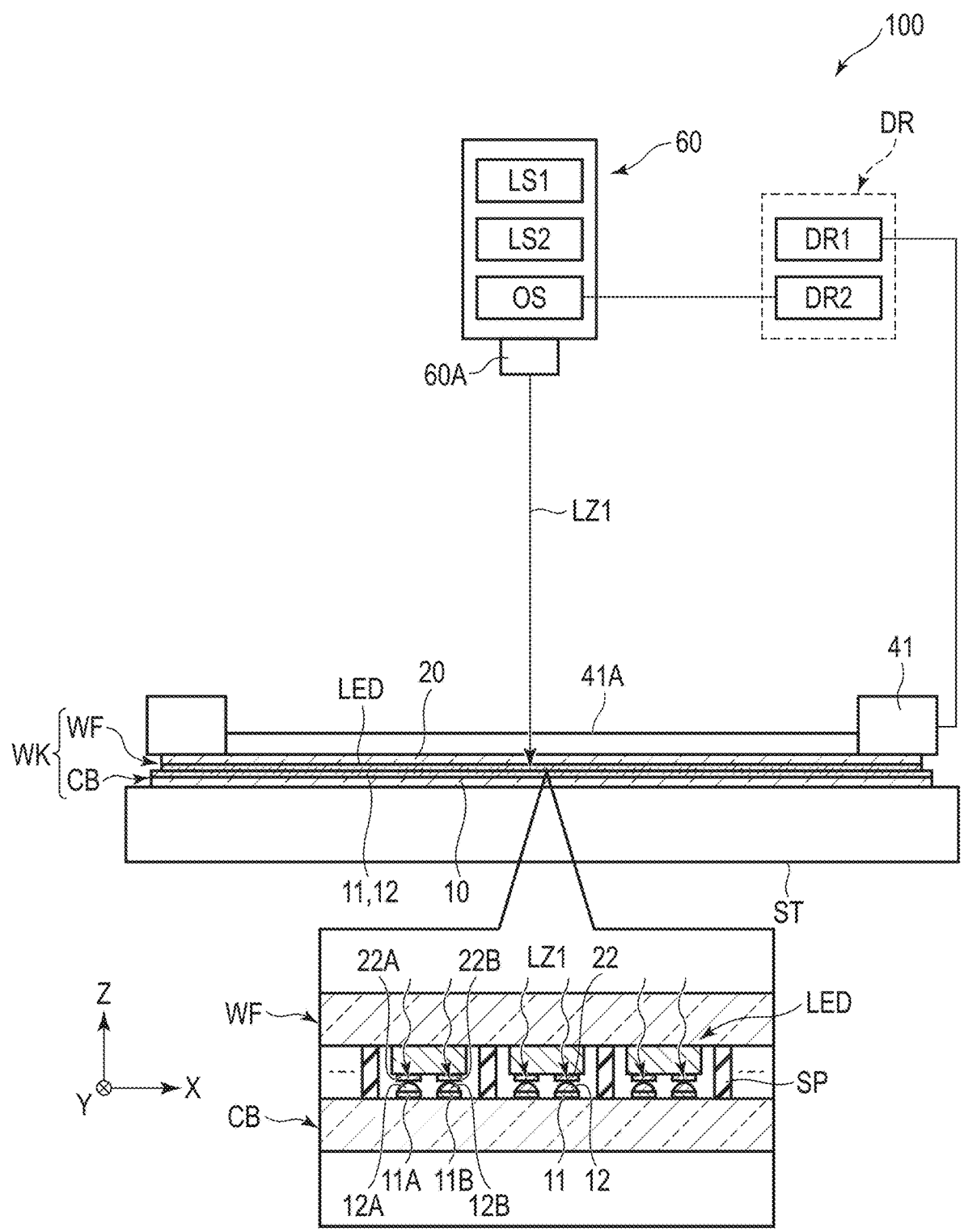
FIG. 7 is a diagram showing a fourth step of the mounting method of this embodiment.

FIG. 7 is a diagram showing a fourth step of the mounting method of this embodiment. The fourth step shows the process of irradiating the first laser beam LZ1 onto the workpiece WK.

The second drive unit DR2 drives the laser device 60 to emit the first laser beam LZ1 from the laser head 60A. The laser device 60 irradiates the first laser beam LZ1 onto the workpiece WK through the window 41A of the pressure jig 41, and thus the light-emitting elements LED are bonded to the circuit board CB. In other words, by heating and melting the joint members 12 by laser ablation, the terminal portions 11 of the circuit board CB and the terminal portions 22 of the wafer WF are respectively joined together. More specifically, the first electrode 22A is joined to the first electrode 11A by the first joint member 12A, and the second electrode 22B is joined to the second electrode 11B by the second joint member 12B. Here, the wavelength band of the first laser beam LZ1 is 400 nm to 3000 nm.

Figure 8:
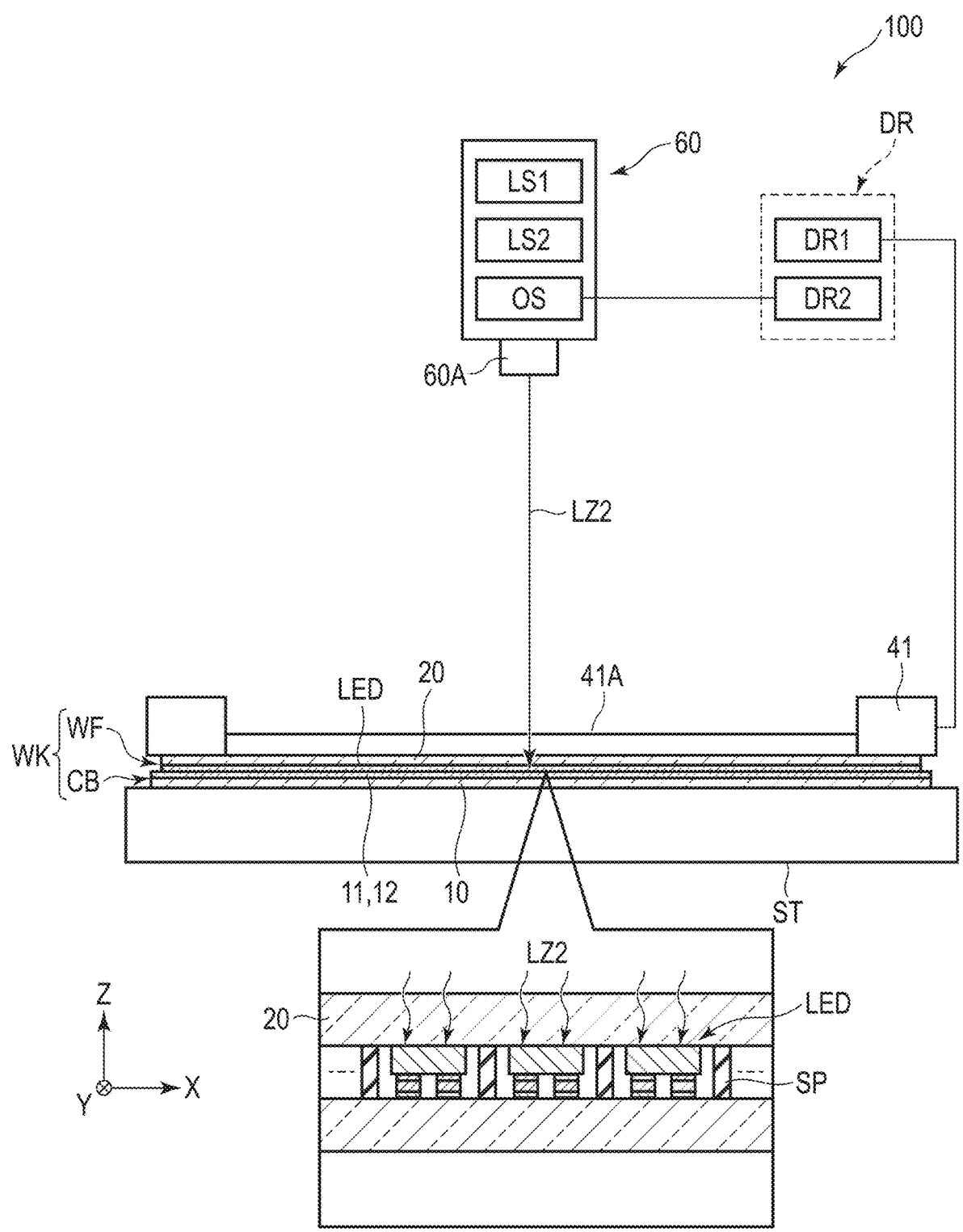
FIG. 8 is a diagram showing a fifth step of the mounting method of this embodiment.

FIG. 8 is a diagram showing a fifth step of the mounting method of this embodiment. The fifth step shows the process of irradiating the second laser beam LZ2 onto the workpiece WK.

The second drive unit DR2 drives the laser device 60 to emit the second laser beam LZ2 from the laser head 60A. The laser device 60 irradiates the second laser beam LZ2 onto the workpiece WK through the window 41A of the pressure jig 41, to remove the light-emitting elements LED from the sapphire substrate 20. The release layer (not shown), which fixates the light-emitting elements LED to the sapphire substrate 20 is sublimated by the laser ablation and thus the light-emitting elements LED are removed from the sapphire substrate 20. The second laser beam LZ2 has a wavelength band different from that of the first laser beam LZ1. The wavelength band of the second laser beam LZ2 is from 200 nm to 366 nm.

Figure 9:
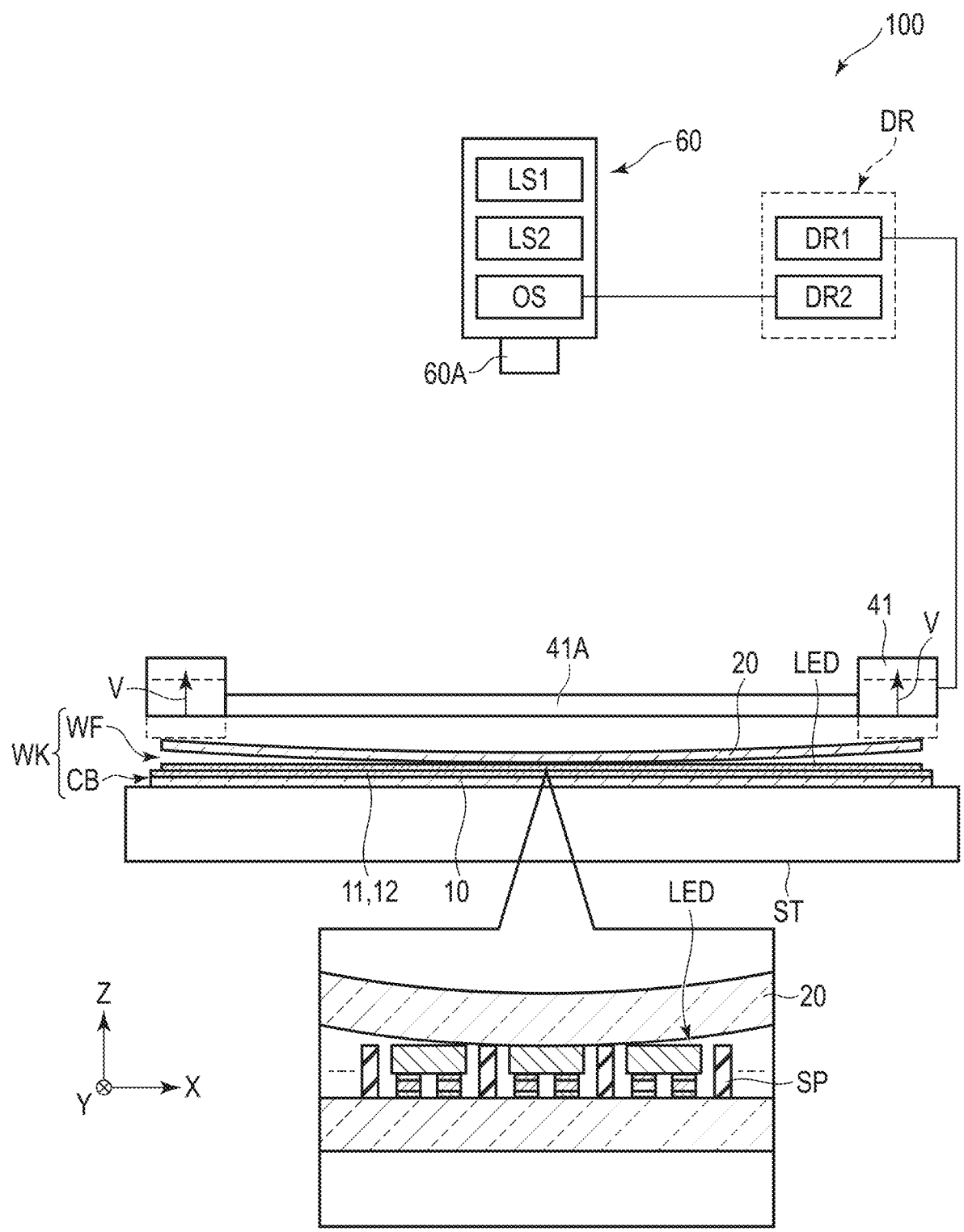
FIG. 9 is a diagram showing a sixth step of the mounting method of this embodiment.

FIG. 9 is diagram showing a sixth step of the mounting method of this embodiment. The sixth step shows the process of moving the pressure jig 41.

The first drive unit DR1 moves the pressure jig 41 in the vertical direction V to separate it from the sapphire substrate 20. That is, the pressure jig 41 moves in the vertical direction V to the side where it is separated from the stage ST. As the pressure jig 41 is separated from the workpiece WK, the warped state of the sapphire substrate 20 restores the state shown in FIG. 4. As shown in the figure, the light-emitting elements LED are separated from the sapphire substrate 20.

Figure 10:
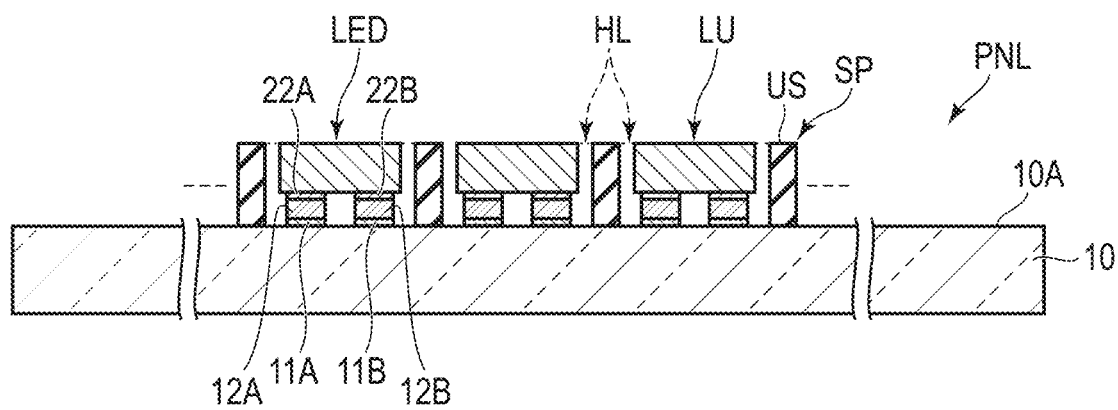
FIG. 10 is a cross-sectional view schematically showing a configuration of a display panel.

FIG. 10 shows a cross-sectional view schematically showing the configuration of the display panel PNL. FIG. 10 shows the display panel PNL manufactured by mounting the light-emitting elements LED on the circuit board CB shown in FIG. 2 using the wafer WF shown in FIG. 3.

The display panel PNL comprises an insulating substrate 10 having a surface 10A, a spacer SP located on the surface 10A side and including a plurality of hole portions HL, a plurality of light-emitting elements LED located on the surface 1A side and in the hole portions HL, respectively, and the like. Further, the display panel PNL comprises the first electrode 11A and the second electrode 11B, and the first joint member 12A and the second joint member 12B, mentioned above.

The upper surface US of the spacer SP and the upper surfaces LU of the light-emitting elements LED are located on the same plane. The upper surfaces LU of the light-emitting elements LED each correspond to a light-emitting surface frim which light is emitted, for example. The first electrode 22A of each light-emitting element LED is connected to the respective first electrode 11A via the respective first joint member 12A. The second electrode 22B of each light-emitting element LED is connected to the respective second electrode 11B via the respective second joint member 12B.

The display panel PNL may comprise an adhesive layer covering the spacer SP, the light-emitting elements LED and the like and an insulating substrate covering the adhesive layer. The adhesive layer is formed from, for example, optical conductive adhesive (OCA) or optical clear resin (OCR). Further, the display panel PNL may as well comprise a resin layer covering the spacer SP, the light-emitting elements LED and the like.

FIG. 11 is a plan view showing the circuit board CB and the wafer WF of this embodiment. FIG. 11, part (a), shows the circuit board CB. FIG. 11, part (b), shows the wafer WF. Using the wafer WF shown in FIG. 11, part (b), the light-emitting elements LED are mounted the circuit board CB shown in FIG. 11, part (a).

As shown in FIG. 11, part (a), the external shape of the circuit board CB is rectangular. That is, the external shape of the insulating substrate 10 is rectangular. The spacer SP is grid-shaped in planar view. The spacer SP comprises a plurality of first portions SP1 extending along the first direction X and aligned along the second direction Y, and a plurality of second portions SP2 extending along the second direction Y and aligned along the first direction X. Each hole portion HL is equivalent to a space enclosed by each respective pair of first portions SP1 adjacent to each other and the each respective pair of second portions SP2 adjacent to each other. The hole portions HL are arranged in a matrix along the first direction X and the second direction Y. The hole portions HL are aligned along the first direction X at a pitch PT1 and along the second direction Y at a pitch PT2. In the example illustrated, each terminal section 11 is located in each respective hole portion HL. As described above, each terminal section 11 is composed of a pair of a first electrode 11A and a second electrode 11B.

As shown in FIG. 11, part (b), the outer shape of the wafer WF is circular. That is, the outer shape of the sapphire substrate 20 is circular. The light-emitting elements LED are arranged in a matrix along the first direction X and the second direction Y. The light-emitting elements LED are aligned along the first direction X at a pitch PT3 and along the second direction Y at a pitch PT4. The pitch PT3 is equal to the pitch PT1 for the hole portions HL. The pitch PT4 is equal to the pitch PT2 for the hole portions HL.

As shown in FIG. 6, when the sapphire substrate 20 is flattened, light-emitting elements LED are respectively contained within hole portions HL. Then, one light-emitting element LED is mounted in substantially all of the hole portions. Note here that the planar shapes of the circuit board CB and the wafer WF are not limited to those of the example provided above.

Figure 12:
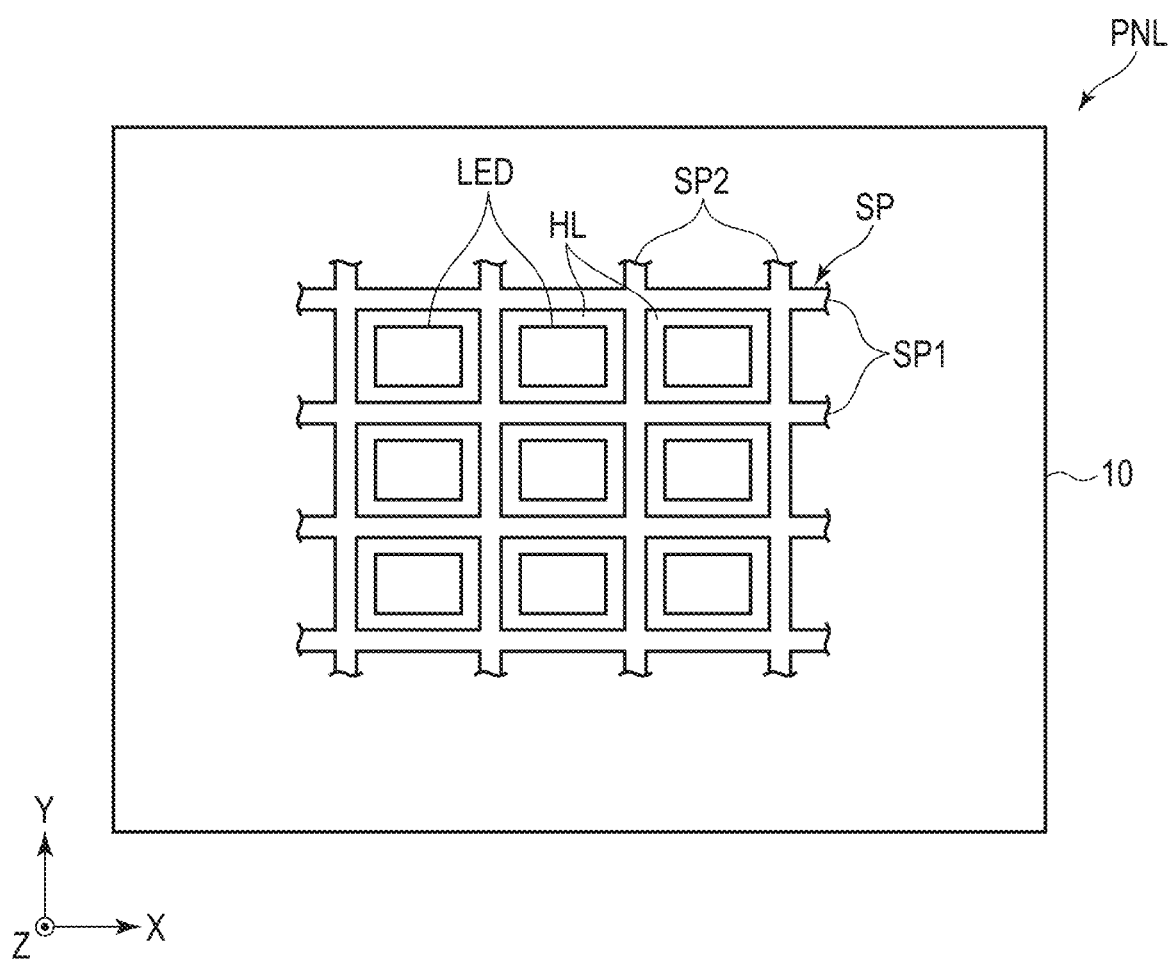
FIG. 12 is a plan view showing the display panel of this embodiment.

FIG. 12 is a plan view showing the display panel PNL of this embodiment. FIG. 12 shows the display panel PNL manufactured by mounting the light-emitting elements LED on the circuit board CB shown in FIG. 11, part (a) using the wafer WF shown in FIG. 11, part (b).

One light-emitting element LED is mounted in each of the hole portions HL. Each light-emitting element LED is surrounded by each pair of first portions SP1 adjacent to each other and each pair of second portions SP2 adjacent to each other.

In the example provided above, a single wafer WF is used for a single circuit board CB. Here, for example, if the area of the circuit board CB is equivalent to the area of a plurality of wafers WF, the light-emitting element LEDs are mounted while exchanging the wafers WF. Further, when mounting light-emitting elements LED of different colors, such as red, green and blue, the mounting may be carried out starting from the respective wafers containing light-emitting elements LED of the respective color.

Figure 13:
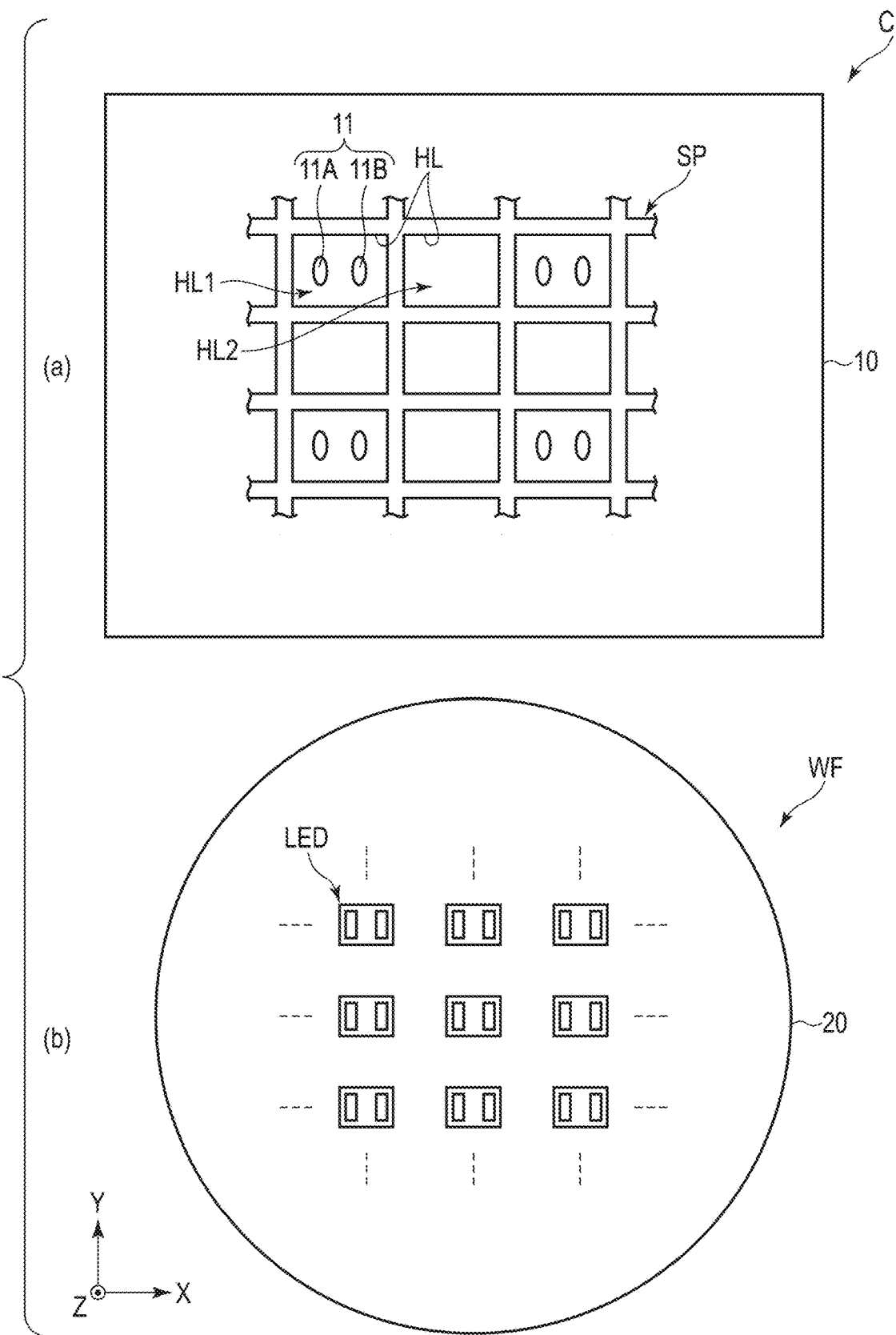
FIG. 13 is a plan view showing a circuit board and a wafer according to a first modified example.

FIG. 13 is a plan view showing a circuit board CB and a wafer WF according to the first modified example. FIG. 13, part (a) shows the circuit board CB. FIG. 13, part (b), shows the wafer WF. The light-emitting elements LED are mounted on the circuit board CB shown in FIG. 13, part (a) using the wafer WF shown in FIG. 13, part (b). The configuration of the wafer WF shown in FIG. 13, part (b) is identical to that of the wafer WF shown in FIG. 11, part (b).

The circuit board CB shown in FIG. 13, part (a) is different from that of FIG. 11, part (a) in that there are hole portions HL in which the terminal portions 11 are not placed. The hole portions HL includes first hole portions HL1 and second hole portions H L2. The terminal portions 11 are located in the first hole portions HL1, respectively, but not in the second hole portions HL2. In the example illustrated, the terminal portions 11 are disposed in those hole portions HL of every other one along the first direction X and those in every other one along the second direction Y.

As shown in FIG. 6, when the sapphire substrate 20 is flattened, each light emitting element LED is contained in each respective hole portion HL. A single light-emitting element is mounted in each of the hole portions HL where the terminal 11 is located. The light-emitting elements LED not used for mounting are not removed from the wafer WF. Thus, by providing hole portions HL even at the positions corresponding to the light-emitting elements LED which are not to be mounted, it is possible to prevent light-emitting elements from abutting against the spacer.

Figure 14:
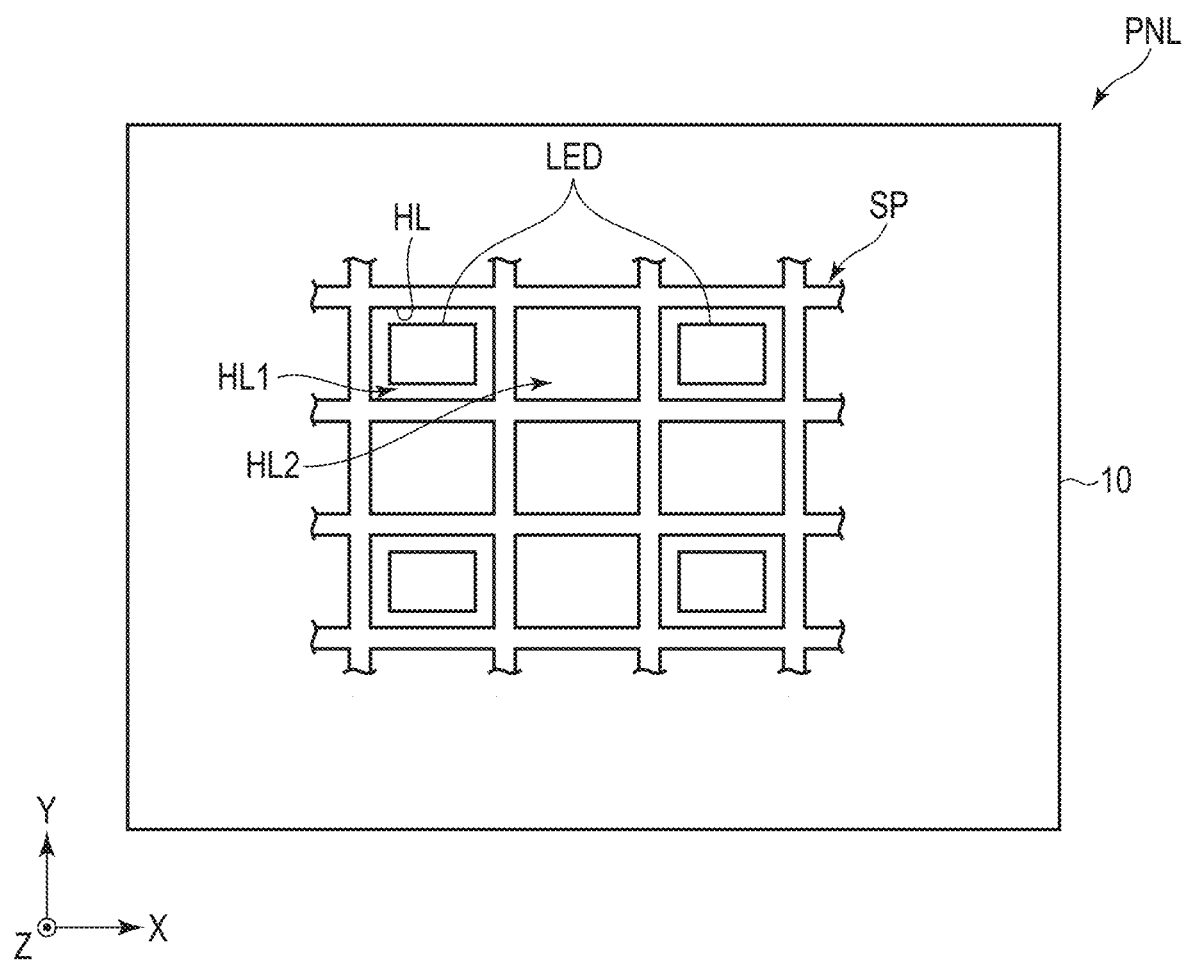
FIG. 14 shows a plan view showing a display panel of the first modified example.

FIG. 14 is a plan view showing a display panel PNL according to the first modified example. FIG. 14 shows the display panel PNL manufactured by mounting the light-emitting elements LED on the circuit board CB shown in FIG. 3, part (a) using the wafer WF shown in FIG. 13, part (b).

The light-emitting elements LED are located in the first hole portions HL1, but not in the second hole portions HL2. In the example illustrated, the light-emitting elements LED are provided in those hole portion HL1 every other one along the first direction X, and those hole portions HL every other one along the second direction Y. Note that the layout of the hole portion portions HL where the light-emitting elements LED are placed and the hole portions HL where the light-emitting elements LED are not placed, is not limited to that of this example. Further, in the hole portions where the light-emitting elements LED are not placed, other electronic components such as optical sensors may be placed.

FIG. 15 is a plan view showing a circuit board CB and a wafer WF in the second modified example. FIG. 15, part (a), shows the circuit board CB. FIG. 15, part (b), shows the wafer WF. The light-emitting elements LED are mounted on the circuit board CB shown in FIG. 15, part (a), using the wafer WF shown in FIG. 15, part (b). The configuration of the wafer WF shown in FIG. 15, part (b), is identical to that of the wafer WF shown in FIG. 11, part (b).

The circuit board CB shown in FIG. 15, part (a) is different from that of FIG. 11, part (a) in that the second portions SP2 of the spacer SP are not formed. That is, the spacer SP includes a plurality of first portions SP1 extending along the first direction X and aligned along the second direction Y. The hole portions HL extend in the first direction X and are aligned in the second direction Y. Further, multiple terminal portions 11 are located in each hole portion HL.

As shown in FIG. 6, when the sapphire substrate 20 is flattened, multiple light-emitting elements LED are contained in each hole portion HL. Further, the multiple light-emitting elements LED are mounted in each hole portion HL.

Figure 16:
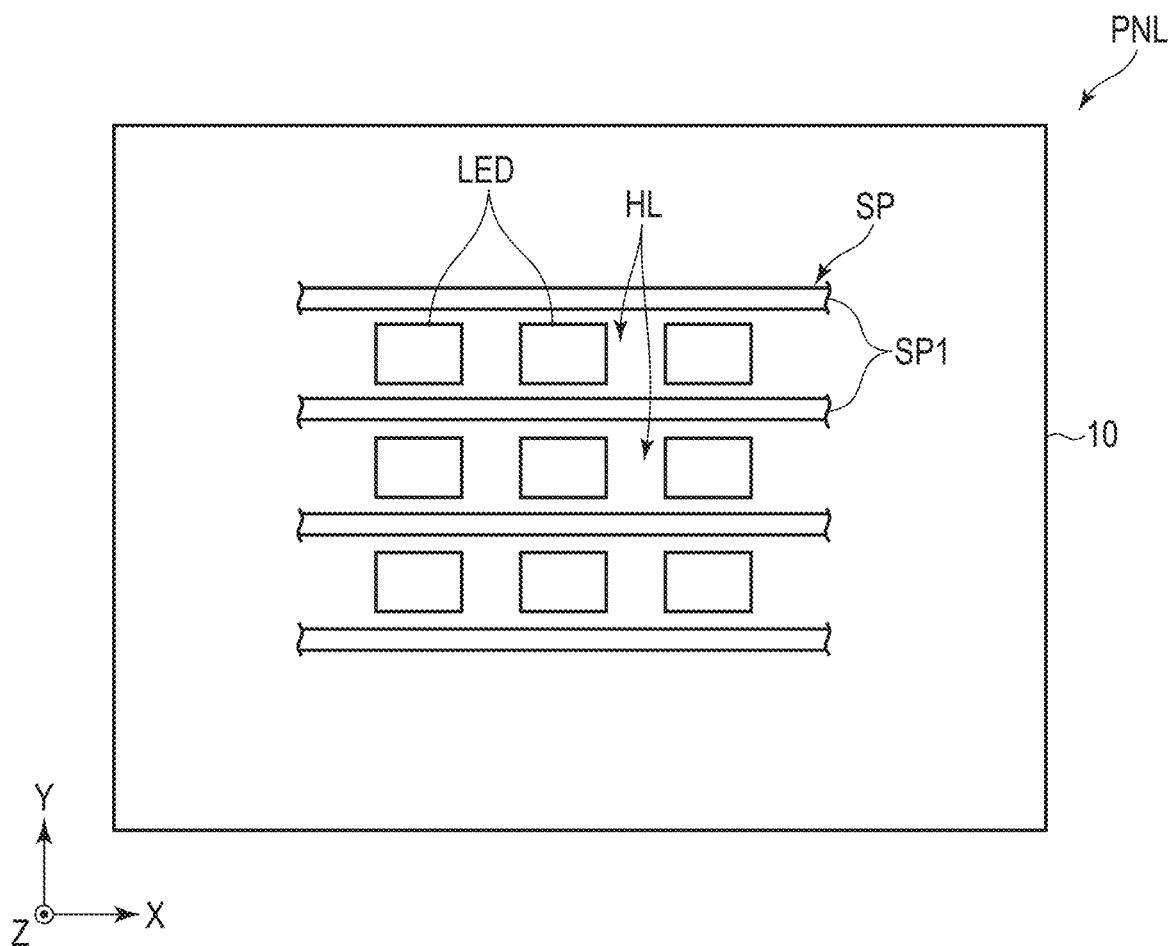
FIG. 16 shows a plan view showing a display panel of the second modified example.

FIG. 16 is a plan view showing the display panel PNL of the second modified example. FIG. 16 shows the display panel PNL manufactured by mounting the light-emitting elements LED on the circuit board CB shown in FIG. 5, part (a) using the wafer WF shown in FIG. 15, part (b).

A plurality of light-emitting element LEDs are located in a single hole portion HL. In the example illustrated, the hole portions HL each extend along the first direction X, but may extend along the second direction Y. In other words, only the second portions SP2 may be formed in the spacer SP without forming the first portions SP1.

As described above, according to the present embodiment, a method of mounting electronic components, which can improve the yield, a display device and a circuit board can be obtained.

Note that the specification describes the light-emitting elements as an example of electronic components, but the present embodiment is applicable to electronic components other than light-emitting elements as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of mounting electronic components, comprising:
    placing a workpiece comprising an insulating substrate including a first surface, a circuit board including a terminal portion located on a side of the first surface and a spacer, a sapphire substrate including a second surface and a wafer including the electronic components located on a side of the second surface, between a stage and a pressure jig so that the first surface and the second surface oppose each other;

bringing the pressure jig into contact with a part of the sapphire substrate to apply a load on a contact part between a part of an upper surface of the spacer and the second surface;

pressing the sapphire substrate toward the circuit board with the pressure jig to bring other part of the upper surface of the spacer into contact with the second surface and flatten the sapphire substrate;

irradiating first laser beam onto the workpiece through a window of the pressure jig, and joining the electronic components to the circuit board;

irradiating second laser light having a wavelength band different from that of the first laser light onto the workpiece through the window, to remove the electronic components from the sapphire substrate; and releasing the pressure jig from the sapphire substrate.

2. The method of claim 1, wherein
when the pressure jig is brought into contact with the part of the sapphire substrate to apply a load to the contact part between the part of the upper surface of the spacer and the second surface, the other part of the upper surface of the spacer is separated from the second surface.

3. The method of claim 1, wherein
when the sapphire substrate is flattened, the entire upper surface of the spacer and the second surface are in contact with each other.

4. The method of claim 1, wherein
the spacer includes a plurality of hole portions, and
when the sapphire substrate is pressurized with the pressure jig toward the circuit board, the electronic components are placed in the hole portions.

5. The method of claim 1, wherein
a rigidity of the spacer is equal to or higher than a rigidity of the sapphire substrate.

* * * * *